(12) United States Patent
Ravi et al.

(10) Patent No.: US 7,842,537 B2
(45) Date of Patent: Nov. 30, 2010

(54) STRESSED SEMICONDUCTOR USING CARBON AND METHOD FOR PRODUCING THE SAME

(75) Inventors: Kramadhati V. Ravi, Atherton, CA (US); Brian S. Doyle, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1342 days.

(21) Appl. No.: 11/058,656

(22) Filed: Feb. 14, 2005

(65) Prior Publication Data

US 2006/0183339 A1   Aug. 17, 2006

(51) Int. Cl.
   *H01L 51/40* (2006.01)
(52) U.S. Cl. .................. 438/99; 257/51; 257/E21.093; 257/E21.27; 257/E27.055; 257/E29.188; 438/105; 438/931
(58) Field of Classification Search .......... 438/457, 438/99, 105, 931; 257/51, E29.188, E21.055, 257/E21.093, E21.618, E21, E21.27, E21.103, 257/E21.105, E21.096
   See application file for complete search history.

(56) References Cited

U.S. PATENT DOCUMENTS

| | | | |
|---|---|---|---|
| 4,969,031 A | 11/1990 | Kobayashi et al. | |
| 5,561,303 A * | 10/1996 | Schrantz et al. | 257/77 |
| 5,907,768 A * | 5/1999 | Malta et al. | 438/105 |
| 6,271,594 B1 * | 8/2001 | Matsubara | 257/760 |
| 6,274,417 B1 * | 8/2001 | Matsubara | 438/211 |
| 6,573,172 B1 | 6/2003 | En et al. | |
| 6,815,310 B2 | 11/2004 | Roberds et al. | |
| 6,830,813 B2 | 12/2004 | Ravi | |
| 6,960,790 B2 * | 11/2005 | Miyai et al. | 257/77 |
| 6,987,028 B2 * | 1/2006 | Ravi | 438/26 |
| 7,247,534 B2 * | 7/2007 | Chidambarrao et al. | 438/223 |
| 2002/0167007 A1 | 11/2002 | Yamazaki et al. | |
| 2004/0266055 A1 | 12/2004 | Ravi | |
| 2005/0019967 A1 | 1/2005 | Ravi | |
| 2005/0285187 A1 * | 12/2005 | Bryant et al. | 257/335 |

* cited by examiner

*Primary Examiner*—Caridad M Everhart
(74) *Attorney, Agent, or Firm*—Laleh Jalali

(57) ABSTRACT

A stressed semiconductor using carbon is provided. At least one carbon layer containing diamond is formed either below a semiconductor layer or above a semiconductor device. The carbon layer induces stress in the semiconductor layer, thereby increasing carrier mobility in the device channel region. The carbon layer may be selectively formed or patterned to localize the induced stress.

18 Claims, 19 Drawing Sheets

STRESSED SEMICONDUCTOR USING CARBON AND METHOD FOR PRODUCING THE SAME

FIELD

Embodiments of the invention relate to the field of semiconductor processing and, more specifically, to the formation of at least one carbon layer to stress semiconductor devices.

BACKGROUND

Integrated circuits (ICs) can include thousands or millions of semiconductor devices, mostly transistors. The motion of free carriers in a semiconductor leads to current. As an electric field is applied to a semiconductor, the electrostatic force causes the carriers to first accelerate and then reach a constant average velocity due to collisions with impurities and lattice vibrations. The ratio of the velocity to the applied field is called the mobility. Increasing carrier mobility in a semiconductor can have many beneficial effects. For example, increasing carrier mobility in the channel region of a Metal-Oxide Semiconductor Field Effect Transistor (MOSFET), or MOS transistor, increases the switching speed of the MOSFET.

Mechanically stressing the semiconductor can increase carrier mobility. For example, in an N-channel MOSFET (or NMOS transistor), the major carriers are electrons. Introducing tensile stress to the channel region of an NMOS transistor increases electron mobility, thereby increasing the NMOS transistor's performance. The major carriers in a P-Channel MOSFET (or PMOS transistor), on the other hand, are holes (or the vacant positions left behind by electrons freed of their covalent bonds.) Introducing compressive stress to the channel region of a PMOS transistor increases hole mobility, thereby increasing the PMOS transistor's performance.

BRIEF DESCRIPTION OF THE DRAWINGS

The invention may best be understood by referring to the following description and accompanying drawings that are used to illustrate embodiments of the invention. In the drawings:

FIG. 2A is a cross-sectional side view of a wafer with a carbon layer deposited over a substrate in accordance with one embodiment of this invention.

FIG. 2B is a cross-sectional side view of the wafer of FIG. 2A, following formation of a photoresist mask over the carbon layer.

FIG. 2C is a cross-sectional side view of the wafer of FIG. 2B, during etching of the carbon layer.

FIG. 2D is a cross-sectional side view of the wafer of FIG. 2C, following etching of the carbon layer.

FIG. 2E is a cross-sectional side view of the wafer of FIG. 2D, following removal of the photoresist mask.

FIG. 2E' is a top view of a wafer consistent with FIG. 2E.

FIG. 3A is a cross-sectional side view of a wafer following abrasion of a substrate surface in accordance with one embodiment of this invention.

FIG. 3B is a cross-sectional side view of the wafer of FIG. 3A, following selective removal of the abrasions.

FIG. 3C is a cross-sectional side view of the wafer of FIG. 3B, following carbon layer formation on the remaining abrasions.

FIG. 4A is a cross-sectional side view of a wafer during deposition of a solution to form a film in accordance with one embodiment of this invention.

FIG. 4B is a cross-sectional side view of the wafer of FIG. 4A, following patterning of the film.

FIG. 4C is a cross-sectional side view of the wafer of FIG. 4B, following carbon layer formation on the patterned film.

FIG. 6A is a cross-sectional side view of the wafer of FIG. 5 and a donor wafer.

FIG. 6B is a cross-sectional side view of the wafers of FIG. 6A, following ion implantation in the donor wafer's semiconductor layer.

FIG. 6C is a cross-sectional side view of the wafers of FIG. 6B, bonded.

FIG. 6D is a cross-sectional side view of the bonded wafer of FIG. 6C, following cleaving of a portion of the semiconductor layer, and formation of devices in the remaining semiconductor layer.

FIG. 7A is a cross-sectional side view of a wafer, following formation of a protective layer over previously formed carbon layers.

FIG. 7B is a cross-sectional side view of the wafer of FIG. 7A, following patterning of the protective layer.

FIG. 7C is a cross-sectional side view of the wafer of FIG. 7B, following formation of an alternatively stressing carbon layer.

FIG. 7D is a cross-sectional side view of the wafer of FIG. 7C, following removal of the protective layer and device formation.

FIG. 9A is a cross-sectional side view of a portion of an integrated circuit, following deposition of a nucleation layer over a device layer.

FIG. 9B is a cross-sectional side view of the portion of the integrated circuit of FIG. 9A, following formation of a mask over the nucleation layer.

FIG. 9C is a cross-sectional side view of the portion of the integrated circuit of FIG. 9B, following patterning of the nucleation layer.

FIG. 9D is a cross-sectional side view of the portion of the integrated circuit of FIG. 9C, following formation of a carbon layer.

FIG. 10A is a cross-sectional side view of a portion of an integrated circuit, following deposition of a carbon layer over a device layer.

FIG. 10B is a cross-sectional side view of the portion of the integrated circuit of FIG. 10A, following patterning of the carbon layer.

FIG. 11A is a cross-sectional side view of a portion of an integrated circuit, following formation of a protective layer over the device layer.

FIG. 11B is a cross-sectional side view of the portion of the integrated circuit of FIG. 11A, following patterning of the protective layer.

FIG. 11C is a cross-sectional side view of the portion of the integrated circuit of FIG. 11B, following deposition of an alternatively stressing carbon layer over the device layer and the patterned protective layer.

FIG. 11D is a cross-sectional side view of the portion of the integrated circuit of FIG. 11C, following patterning of the alternatively stressing carbon layer.

FIG. 11E is a cross-sectional side view of the portion of the integrated circuit of FIG. 11D, following removal of the patterned protective layer.

DETAILED DESCRIPTION

Figure 1:
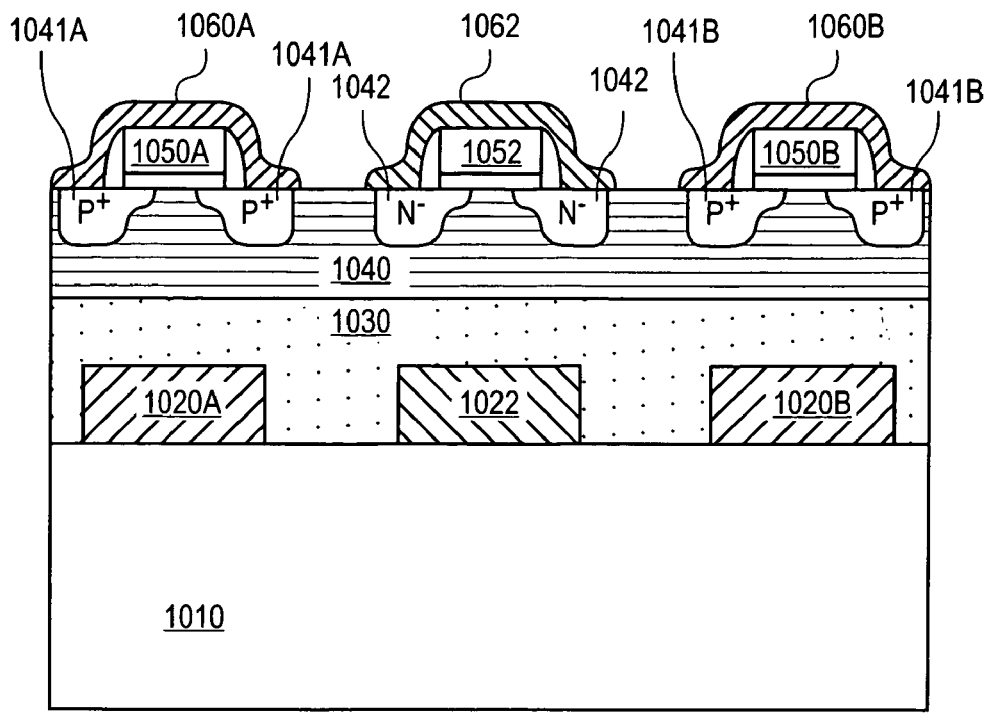
FIG. 1 is a cross-sectional side view of an integrated circuit having carbon layers above and below semiconductor devices in accordance with one embodiment of this invention.

The embodiments of the invention relates to semiconductor devices and methods of producing semiconductor devices under compressive or tensile stress. One or more implementations of the embodiments of the invention will now be described with reference to the drawings, wherein like reference numerals are used to refer to like elements throughout, and wherein the various structures are not necessarily drawn to scale. In the following description, numerous specific details are set forth. However, it is understood that embodiments of the invention may be practiced without these specific details. In other instances, well-known circuits, structures and techniques have not been shown in detail in order not to obscure the understanding of this description.

FIG. 1 depicts one embodiment of this invention. Carbon layers 1020A, 1020B and 1022 are formed on a substrate 1010. Substrate 1010 is a semiconductor material, e.g. silicon. In one embodiment, substrate 1010 is a monocrystalline silicon substrate.

In one embodiment, the carbon layers are composed entirely of diamond (or tetrahedrally-bonded carbon atoms). In another embodiment, the carbon layers are composed of at least diamond and graphite. In those embodiments, carbon layers 1020A, 1020B and 1022 may all have similar ratios of diamond-to-graphite, two may have similar ratios of diamond-to-graphite, or each may have a different ratio of diamond-to-graphite. In certain embodiments, carbon layers producing similar stress (e.g. compressive or tensile stress) in a subsequently formed semiconductor layer will have similar ratios of diamond-to-graphite to facilitate simultaneous formation of the layers.

For example, in the embodiment of FIG. 1, carbon layers 1020A and 1020B, both induce similar stress in semiconductor layer 1040 (e.g. compressive stress). In that embodiment, both carbon layers 1020A and 1020B have similar diamond-to-graphite ratios so that they may be formed simultaneously on the substrate. The ratio of diamond-to-graphite influences conditions (e.g. temperature) under which a carbon layer may be formed to produce a particular stress, as will be explained further below.

Buffer layer 1030 is formed over the carbon layers. In one embodiment, buffer layer 1030 is polycrystalline silicon or polysilicon. In another embodiment, buffer layer 1030 is an oxide, e.g. silicon oxide or silicon dioxide. In one embodiment, buffer layer 1030 comprises two layers, a silicon dioxide layer formed over a polycrystalline silicon layer.

Buffer layer 1030 is sufficiently thick to cover the rough surfaces of carbon layers 1020A, 1020B and 1022. In certain embodiments, buffer layer 1030 is also sufficiently thin to allow heat transfer. In one embodiment buffer layer 1030 is about 5-20 microns thick. Buffer layer 1030 also facilitates formation of semiconductor layer 1040. Semiconductor layer 1040 may be formed using processes such as a layer-transfer process, as shown in FIGS. 6A-6D and described in further detail below.

In certain embodiments, semiconductor layer 1040 is germanium or gallium arsenide. Semiconductor layer 1040 may also be other semiconductor materials, including aluminum arsenide, aluminum gallium arsenide, boron nitride, gallium nitride, indium phosphide, silicon carbide and silicon germanium.

Semiconductor layer 1040 is doped with impurities to produce regions with extra carriers. In FIG. 1, source and drain region 1041A and source and drain region 1041B have been doped to produce regions with extra holes, while source and drain region 1042 has been doped to produce a region with extra electrons. For example, in one embodiment, semiconductor layer 1040 is silicon, regions 1041A and 1041B are doped with either boron or aluminum to produce extra holes, and region 1042 is doped with either phosphorous or arsenic to produce extra electrons.

The channel regions between each source and drain region may or may not be doped. In embodiments where a channel region is doped, it is doped with a material to produce a conductivity opposite to that of the corresponding source and drain region. For example, if source and drain region 1041A is doped to produce extra holes (e.g. with boron), the channel region between source regions 1041A may be doped to produce extra carriers (e.g. with phosphorous). Likewise, if source and drain region 1041A is doped to produce extra carriers (e.g. with phosphorous), the channel region between source regions 1041A may be doped to produce extra holes (e.g. with boron). However, in other embodiments, one or more of the channel regions may not be doped.

Devices 1050A, 1050B and 1052 are formed in semiconductor layer 1040. In the embodiment of FIG. 1, devices 1050A and 1050B are PMOS transistors and device 1052 is an NMOS transistor. Devices 1050A, 1050B and 1052 are devices which will benefit from the stress introduced in semiconductor layer 1040 by carbon layers 1020A, 1020B and 1022. For example, in FIG. 1, devices 1050A and 1050B are PMOS transistors and device 1052 is an NMOS transistor. The PMOS transistors benefit from compressive stress introduced in semiconductor layer 1040 by carbon layers 1020A and 1020B. The NMOS transistor benefits from tensile stress introduced in semiconductor layer 1040 by carbon layer 1022.

Furthermore, in the embodiment of FIG. 1, carbon layers 1060A, 1060B and 1062 are formed over devices 1050A, 1050B and 1052, respectively. Carbon layers 1060A and 1060B introduce compressive stress in devices 1050A and 1050B, thereby increasing hole carrier mobility in the channel regions of devices 1050A and 1050B. Carbon layer 1062 introduces tensile stress in device 1052, thereby increasing electron carrier mobility in the channel region of device 1052.

In another embodiment of this invention, carbon layers are formed under, but not over, the device layer. For example, in one embodiment, carbon layers 1020A, 1020B and 1022 may be formed, but carbon layers 1060A, 1060B or 1062 may not be formed. Carbon layers may also be formed under some devices, but not under others. For example, carbon layers 1020A and 1020B may be formed under devices 1050A and 1050B, respectively, but carbon layer 1022 may not be formed under device 1052.

In yet another embodiment of this invention, carbon layers are formed over, but not under the device layer. For example, in one embodiment, carbon layers 1060A, 1060B and 1062 may be formed, but carbon layers 1020A, 1020B or 1022 may not be formed. Carbon layers may also be formed over some devices, but not over others. For example, carbon layer 1062 may be formed over device 1052, but carbon layers 1060A and 1060B may not be formed.

In yet other embodiments, carbon layers are formed over some devices and under others. For example, in one embodiment, carbon layers 1020A and 1020B may be formed under devices 1050A and 1050B to induce compressive stress in the channel region of devices 1050A and 1050B, and carbon layer 1062 may be formed over device 1052 to induce tensile stress in device 1052. However, in that embodiment, carbon layer 1022 is not formed under device 1052 and carbon layers 1060A and 1060B is not formed over device 1050A and 1050B.

In the embodiments described above, and combinations thereof, localized stress is desired to ensure that specific types of stress (compressive or tensile) are induced in certain regions of the semiconductor layer. Several methods may produce this localized stressed.

Figure 2A:
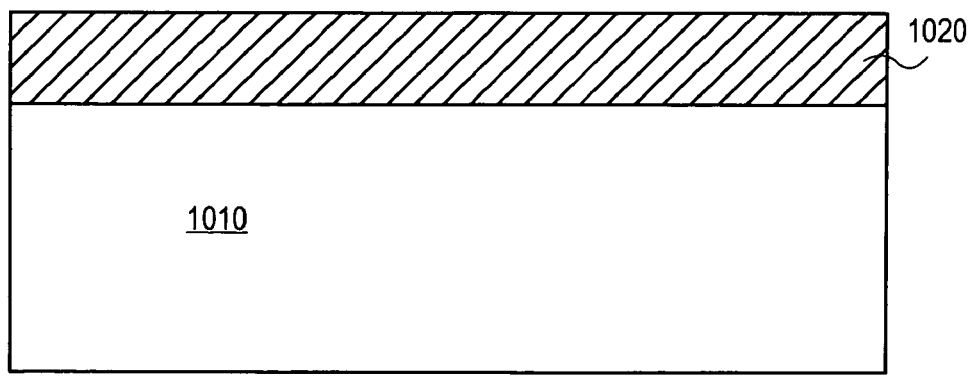
FIGS. 2A-2E are cross-sectional side views of a wafer at various stages of a process to form buried carbon layers in accordance with one embodiment of this invention. Specifically.

FIGS. 2A-2E depict one method of forming carbon layers 1020A and 1020B in accordance with one embodiment of this invention. In FIG. 2A, carbon layer 1020 is deposited directly onto substrate 1010 (which may be a monocrystalline silicon substrate, for example). Carbon layer 1020 is deposited under conditions so as to stress a subsequently formed semiconductor layer.

In the embodiment shown in FIG. 2A, carbon layer 1020 is deposited under conditions so as to stress compressively a subsequently formed semiconductor layer. A carbon layer that compressively stresses the semiconductor layer will be under tensile stress. In other embodiments, carbon layer 1020 may be deposited under conditions so as to stress tensilely the subsequently formed semiconductor layer. A carbon layer that tensilely stresses the semiconductor layer will be under compressive stress.

Factors that determine whether the carbon layer stresses the semiconductor layer compressively or tensilely include deposition temperature, granularity of the carbon particles and ratio of diamond-to-graphite in the carbon. For example, when semiconductor layer 1040 is silicon and carbon layer 1020 is diamond and contains no graphite, depositing carbon layer 1020 at a temperature lower than approximately 700° C. will generally induce compressive stress in the regions of semiconductor layer 1040 subsequently formed above the carbon layer. Therefore, devices formed above those carbon layers (e.g. device 1050A above carbon layer 1020A and device 1050B above carbon layer 1020B) will have channel regions under compressive stress, and therefore increased hole carrier mobility. Therefore, devices 1050A and 1050B are devices which benefit from increased hole carrier mobility, e.g. PMOS transistors.

On the other hand, again when semiconductor layer 1040 is silicon and carbon layer 1020 is diamond and contains no graphite, depositing carbon layer 1020 at temperatures equal to or higher than approximately 700° C. will generally induce tensile stress in the regions of semiconductor layer 1040 subsequently formed above the carbon layer. Therefore, devices formed above the carbon layer (e.g. device 1052 above carbon layer 1022) will have channel regions under tensile stress, and therefore increased electron carrier mobility. Therefore, device 1052 is a device which benefits from increase electron carrier mobility, e.g. an NMOS transistor.

The stress in the subsequently formed semiconductor layer 1040 is generally due to the difference in the coefficient of thermal expansion (CTE) between the carbon layer and the semiconductor layer. CTE is defined as the fractional change in length per unit change in temperature. For example, at about 25° C., the CTE of silicon is approximately 2.5 ppm/C while the CTE of diamond is approximately 1 ppm/C. At about 525° C., the CTE of silicon is approximately 4 ppm/C while the CTE of diamond is approximately 3.8 ppm/C. In the two examples above, the CTE of silicon is higher than the CTE of diamond. Under those conditions, a silicon semiconductor layer formed above a diamond carbon layer will experience compressive stress.

However, at or above about 700° C., the CTE of silicon is lower than the CTE of diamond. For example, at about 925° C., the CTE of silicon is approximately 4.3 ppm/C while the CTE of diamond is approximately 5 ppm/C. Therefore, at or above about 700° C., a silicon semiconductor layer formed above a diamond carbon layer will generally experience tensile stress. In one embodiment, when the diamond is formed at about 1000° C., the differences in CTE between diamond and silicon result in approximately 14% strain in the silicon.

The CTE of the carbon and of the semiconductor may differ by about a factor of four, depending on deposition temperature, as well as other factors such as granularity of the carbon and the diamond-to-graphite ratio in the carbon. Carbon grain sizes approximately equal to or greater than 10 microns generally lead to compressive stresses in the semiconductor layer, while smaller carbon grain sizes generally lead to tensile stress in the semiconductor layer. It will be appreciated however, that these stresses may alter with variations in the deposition temperature and the ratio of diamond-to-graphite in the carbon.

Generally, as graphite content in the carbon increases, the stiffness of the carbon layer decreases and the magnitude of the stress induced by the carbon layer in the semiconductor layer also decreases. Additionally, the carbon layer's ability to spread thermal energy away from the semiconductor layer also decreases as graphite content increases. Conversely, as diamond content increases, the magnitude of the stress induced by the carbon layer in the semiconductor layer also increases, as well as the carbon layer's ability to spread thermal energy. Therefore, to induce specific types and magnitudes of stress in a semiconductor layer, conditions such as deposition temperature, carbon granularity, and diamond-to-graphite ratio may all be varied.

In the embodiment shown in FIG. 2A, carbon layer 1020 is formed under conditions so as to induce compressive stress in a subsequently formed semiconductor layer. In other embodiments, carbon layer 1020 may be formed under conditions so as to induce tensile stress in a subsequently formed semiconductor layer.

In one embodiment, carbon layer 1020 is deposited on substrate 1010 using a reactor, such as a microwave chemical vapor deposition (CVD) reactor, a hot filament CVD reactor, or a pulsed DC reactor. In one embodiment, carbon layer 1020 is deposited on substrate 1010 using a plasma enhanced chemical vapor deposition (PECVD) reactor. In one such embodiment, the process gas is 1-5% methane, and 95-99% hydrogen, the gas pressure is 5-50 Torr, and the reactor power is 25-200 KW. In one embodiment, carbon layer 1020 is deposited to a thickness of about 5-50 microns.

Figure 2D:
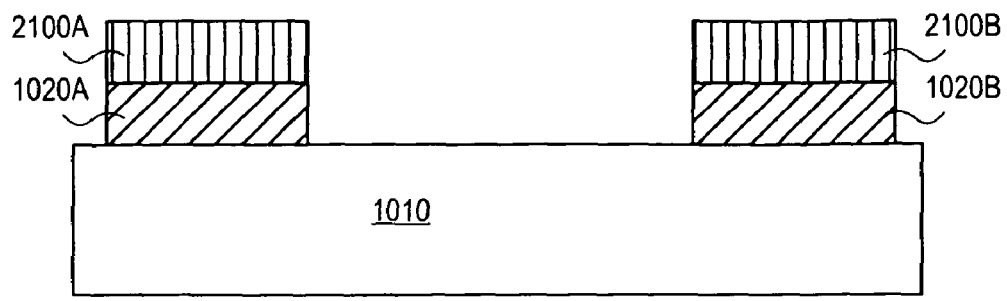
Figure 2E:
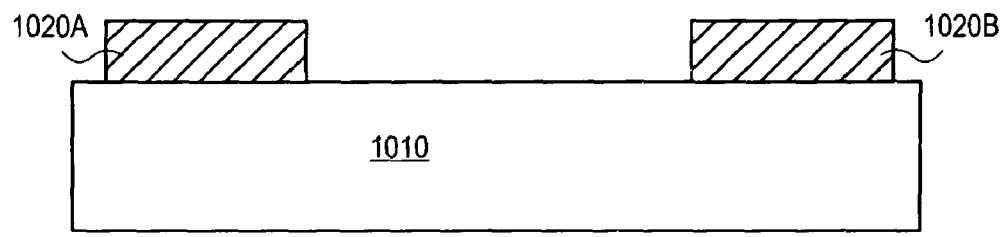
Figure 2E:
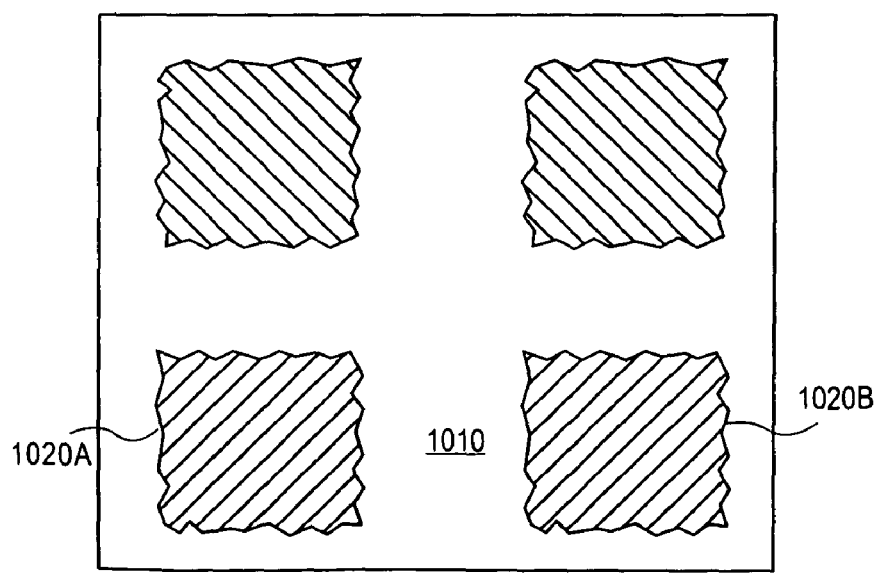
Figure 2B:
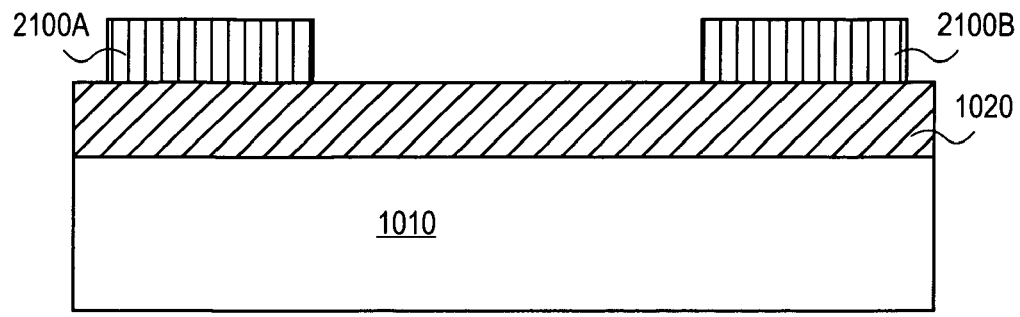
Figure 2C:
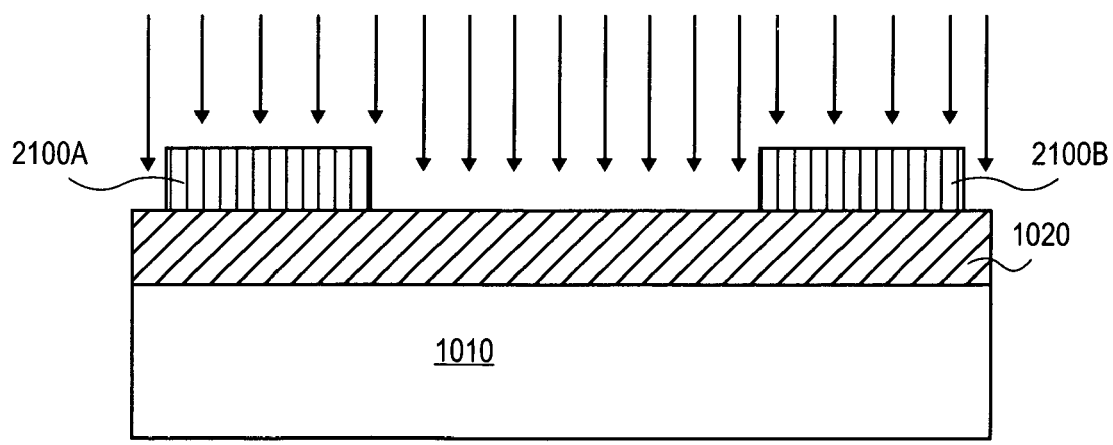

Following deposition, carbon layer 1020 may be patterned so as to induce localized stress in a subsequently formed semiconductor layer, as shown in FIGS. 2B-2E. Carbon layer may be patterned using masking and etching techniques. For example, a photoresist mask 2100A and 2100B may be formed over the carbon layer, as shown in FIG. 2B, using well-known photolithography techniques (e.g. masking, exposing and developing). The carbon layer may then be etched in alignment with the mask to remove regions of carbon where carbon is undesired, as shown in FIG. 2C.

In one embodiment, carbon layer 1020 is wet etched by immersion in a liquid bath of chemical etchant selected to remove carbon. In another embodiment, carbon layer 1020 is dry etched by bombardment of ions that dislodge portions of the exposed carbon layer. FIG. 2D depicts the result of the etching. Carbon layer 1020 is now discontinuous, with sections labeled 1020A and 1020B. The mask 2100 is then removed, leaving carbon layers 1020A and 1020B over substrate 1010, as shown in FIG. 2E.

FIG. 2E' shows a top view of an embodiment consistent with FIG. 2E. Specifically, FIG. 2E' shows four islands of carbon to stress subsequently formed semiconductor regions above each island. In certain embodiments, each island compressively stresses the corresponding semiconductor region. In other embodiments, each island tensilely stresses the corresponding semiconductor region. In yet other embodiments, one or more island may compressively stress, while others may tensilely stress, semiconductor regions above the respective island.

In the embodiment of FIG. 2A, since carbon layer 1020 was formed under conditions so as to compressively stress a subsequently formed semiconductor layer, carbon layers 1020A and 1020B will compressively stress regions of a semiconductor layer subsequently formed over those carbon layers. Therefore, devices formed in the semiconductor layer above carbon layers 1020A and 1020B are devices which benefit from compressively stressed semiconductor regions, e.g. PMOS transistors.

A PMOS transistor formed over a compressively stressed semiconductor layer will have a compressively stressed channel region, and therefore, increased hole carrier mobility. On the other hand, an NMOS transistor formed over a compressively stressed semiconductor layer will have a compressively stressed channel region which will decrease, rather than increase, electron carrier mobility. Therefore, in embodiments which include both PMOS and NMOS devices, carbon layer 1020 is patterned so as to induce compressive stress in regions of the semiconductor layer in which PMOS devices will be formed, and not to induce compressive stress in regions in which NMOS devices will be formed. In other embodiments, carbon layer 1020 may be patterned so as induce tensile stress in regions in which NMOS devices will be formed, and not to induce tensile stress in regions in which PMOS devices will be formed. In other words, in certain embodiments (e.g. those which include both PMOS and NMOS devices), carbon layer 1020 is discontinuous so as to induce localized stress in the semiconductor layer where appropriate.

In one embodiment, substrate 1010 may be treated prior to the formation of a carbon layer to enhance carbon nucleation. Methods for pre-treating substrate 1010 including scratching, seeding, electrical biasing, covering/coating, ion implantation, pulsed laser radiation, and carburization.

Figure 3A:
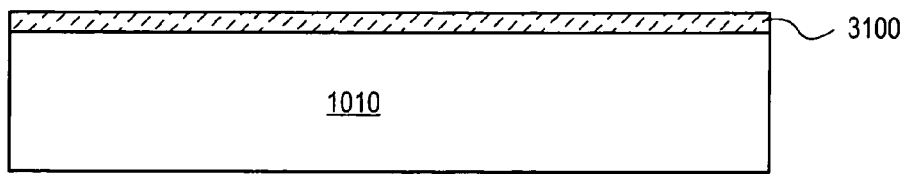
FIGS. 3A-3C are cross-sectional side views of a wafer at various stages of another process to form buried carbon layers in accordance with another embodiment of this invention. Specifically.
Figure 3B:
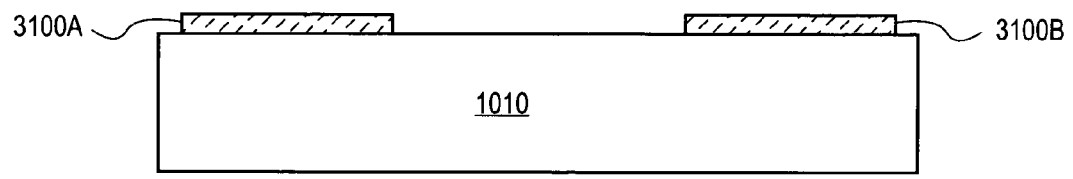
Figure 3C:
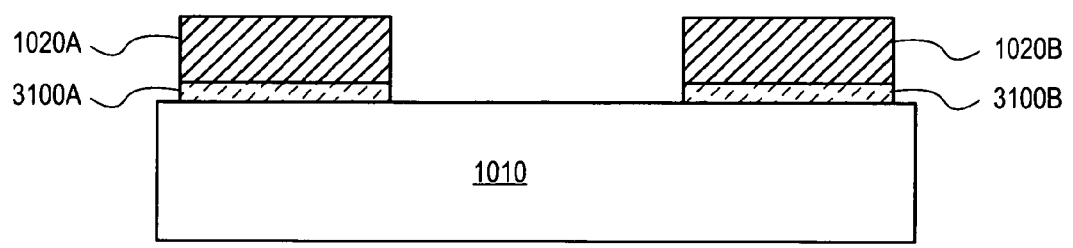

In certain embodiments, rather than patterning a blanket deposited carbon layer to form carbon layers 1020A and 1020B, carbon layers 1020A and 1020B are grown over selectively formed nucleation sites. FIGS. 3A-3C depicts one method of using nucleation sites to form carbon layers in accordance with one embodiment of this invention.

In FIG. 3A, a surface of substrate 1010 is abraded, forming a layer of damaged substrate 3100. In one embodiment, the substrate is abraded by polishing the substrate with an abrasive grit, such as diamond powder of 0.1 to 10 μm, either mechanically or by ultrasonic agitation. In another embodiment, the substrate is abraded by ion bombardment. For example, the substrate may be placed in a microwave deposition reactor and a negative biased of a few hundred volts added to the substrate. Ions are then allowed to abrade the surface.

This damaged layer 3100 is then patterned to produce sites 3100A and 3100B, as shown in FIG. 3B, using known methods of patterning, such as masking and etching. The patterned damaged layer acts as nucleation sites on which carbon layers 1020A and 1020B may be selectively grown to a desired thickness and under conditions to induce specific stress in a subsequently formed semiconductor layer, as shown in FIG. 3C.

For example, in FIG. 3C, carbon layers 1020A and 1020B are formed under conditions so as to induce compressive stress in a semiconductor layer. In one embodiment, carbon layers 1020A and 1020B are formed on nucleation sites 3100A and 3100B using plasma enhanced CVD processes, similar to those previously described with regard to FIG. 2A. For example, 1-5% methane and 95-99% hydrogen methane may be used as process gases during the PECVD process. In another embodiment, carbon layers 1020A and 1020B are formed using other known processes (e.g. hot-filament CVD or pulsed DC).

Carbon layers 1020A and 1020B are formed to a thickness to induce a desired magnitude of stress in the semiconductor layer. This thickness may therefore depend on the diamond-to-graphite ratio, the granularity of the carbon layers and the deposition temperature. In certain embodiments, for example, carbon layers 1020A and 1020B is diamond and contains no graphite, carbon layers 1020A and 1020B may each be grown to a thickness of about 5-50 microns.

Figure 4A:
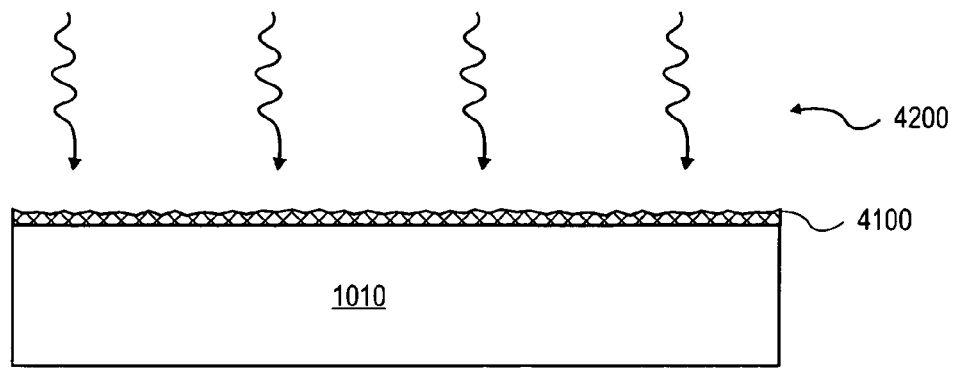
FIGS. 4A-4C are cross-sectional side views of a wafer at various stages of another process to form buried carbon layers in accordance with another embodiment of this invention. Specifically.
Figure 4B:
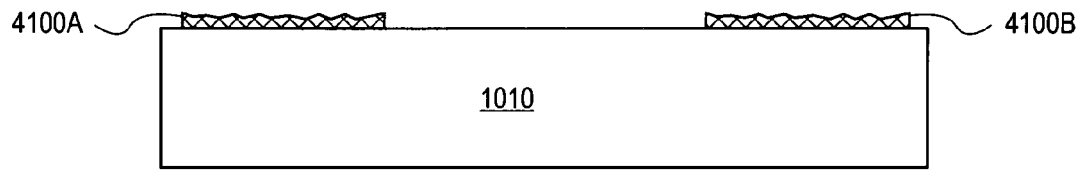
Figure 4C:
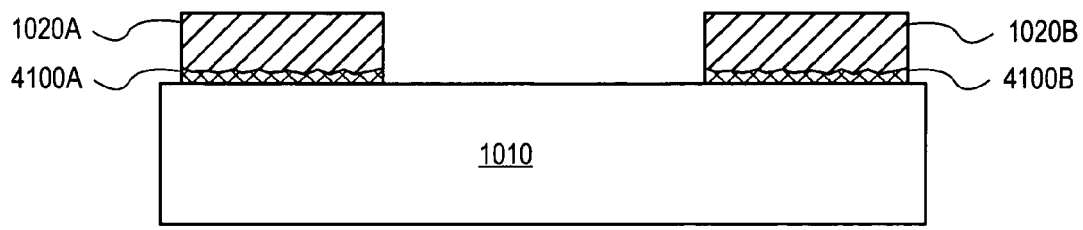

FIGS. 4A-4C depict yet another method of forming carbon layers using nucleation sites in accordance with one embodiment of this invention. In FIG. 4A, a solution 4200 is deposited on a surface of substrate 1010 to form film 4100. For example, in one embodiment, solution 4200 is a polymer in solvent such as acetone with a suspension of nano-crystalline diamond particles. The polymer may be a photoresist. In such an embodiment, solution 4200 is deposited on substrate 1010 using known methods, such as spraying or spinning. The solvent evaporates, leaving a dispersion of diamond particles on substrate 1010. In other embodiments, solution 4200 includes diamond-like amorphous carbon or graphite.

The deposited solution is then patterned to produce sites 4100A and 4100B, as shown in FIG. 4B, using known methods, such as masking and etching. The patterned solution acts as nucleation sites on which carbon layers 1020A and 1020B may be formed, as shown in FIG. 4C. In one embodiment, carbon layers 1020A and 1020B may be formed on nucleation sites 4100A and 4100B using PECVD processes, or other known processes (e.g. hot-filament CVD or pulsed DC), as previously described. In certain embodiments, carbon film 1020 may also be formed to a thickness of about 5-50 microns, again as previously discussed.

Figure 5:
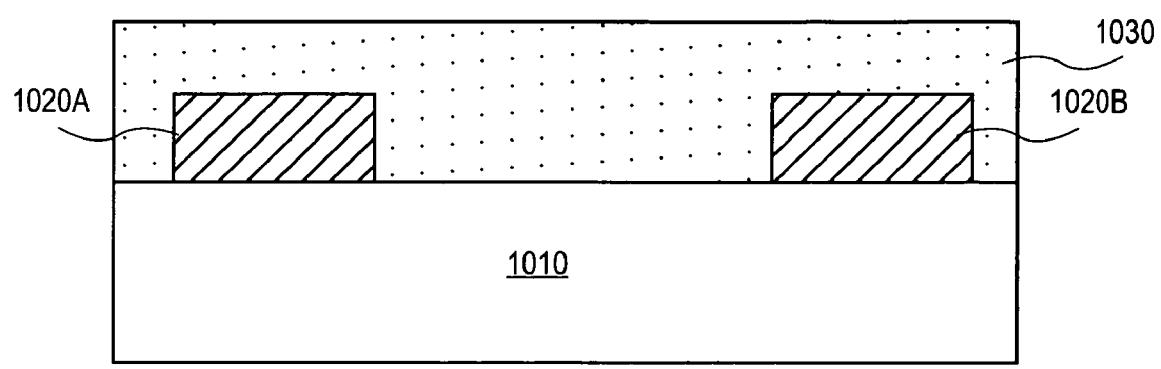
FIG. 5 is a cross-sectional side view of a wafer having buried carbon layers in accordance with one embodiment of this invention.

Buffer layer 1030 is then formed over the carbon layers and polished, as shown in FIG. 5. In embodiments in which localized stress is not desired (e.g., for example, in which all the devices benefit from compressive stress in the semiconductor layer, or in which all the devices benefit from tensile stress in the semiconductor layer), the carbon layer may not be patterned or selectively grown. In those embodiments, buffer layer 1030 may be formed over a continuous carbon layer.

As previously described, in certain embodiments, buffer layer 1030 may be polycrystalline silicon or silicon dioxide. Layer 1030 is sufficiently thick to cover the rough surfaces of the carbon layer(s). For example, in one embodiment in which the carbon layer is about 5 microns thick, buffer layer 1030 is between about 5-20 microns thick. In certain embodiments intended for silicon-on-insulator (SOI) structures, layer 1030 may be a polished polysilicon layer, over which an insulating silicon dioxide layer is formed.

In certain embodiments, the semiconductor layer is bonded to the buffer layer using a layer transfer process, as previously suggested. FIGS. 6A-6D depicts such a layer transfer process.

Figure 6A:
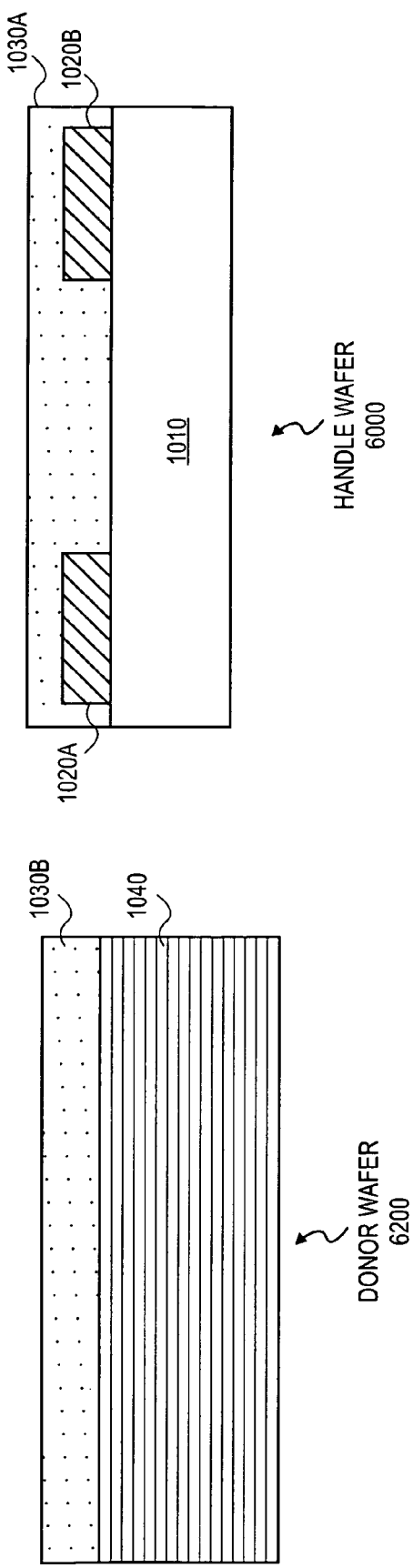
FIGS. 6A-6D are cross-sectional side views of portions of an integrated circuit at various stages of a process to form devices over buried carbon layers in accordance with one embodiment of this invention. Specifically.

In FIG. 6A, donor wafer 6200, has a buffer layer 1030B formed over a semiconductor layer 1040. In one embodiment, semiconductor layer 1040 is device quality silicon. In other embodiments, semiconductor 1040 may be another semiconductor material, such as silicon, silicon carbide, silicon germanium, gallium arsenide, gallium nitride, germanium, aluminum arsenide, aluminum gallium arsenide, boron nitride or indium phosphide.

Figure 6B:
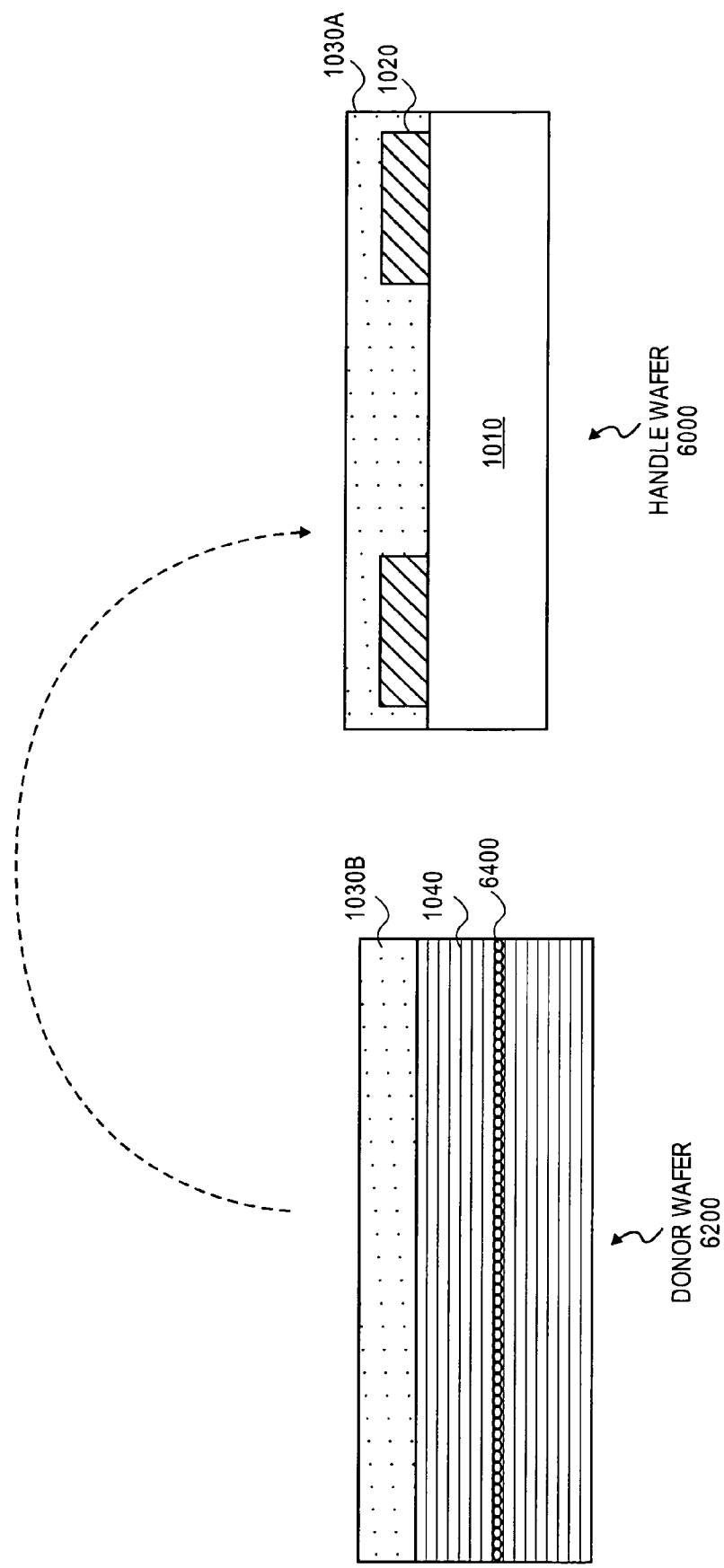

In FIG. 6B, ions 6400 are implanted into semiconductor layer 1040. In one embodiment, the ions are hydrogen or other light species. The ion implantation forms a weakened semiconductor layer that later splits or is cleaved from donor wafer 6200. This ion implantation method is used in layer transfer processes such as SmartCut® (also known as Unibond® or IonCut®) and NanoCleave™. In other embodiments, rather than implanting ions, a layer of porous silicon is used to form the splitting layer. The layer of porous silicon may be formed by anodic etching and annealing as in, for example, the ELTRAN™ process.

Figure 6C:
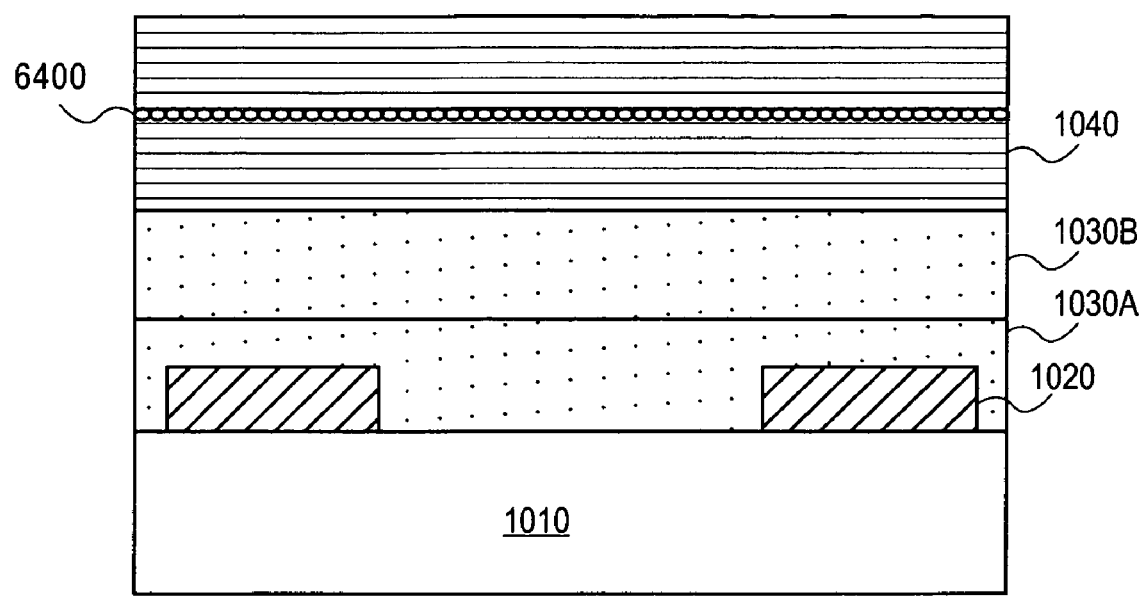

In FIG. 6C, buffer layer 1030B of donor wafer 6200 is bonded to buffer layer 1030A. In one embodiment, buffer layer 1030A is an oxide and buffer layer 1030B is polysilicon. In another embodiment, buffer layer 1030A is polysilicon with an oxide top layer and buffer layer 1030B is an oxide. In yet other embodiments, buffer layer 1030B may not be present.

Figure 6D:
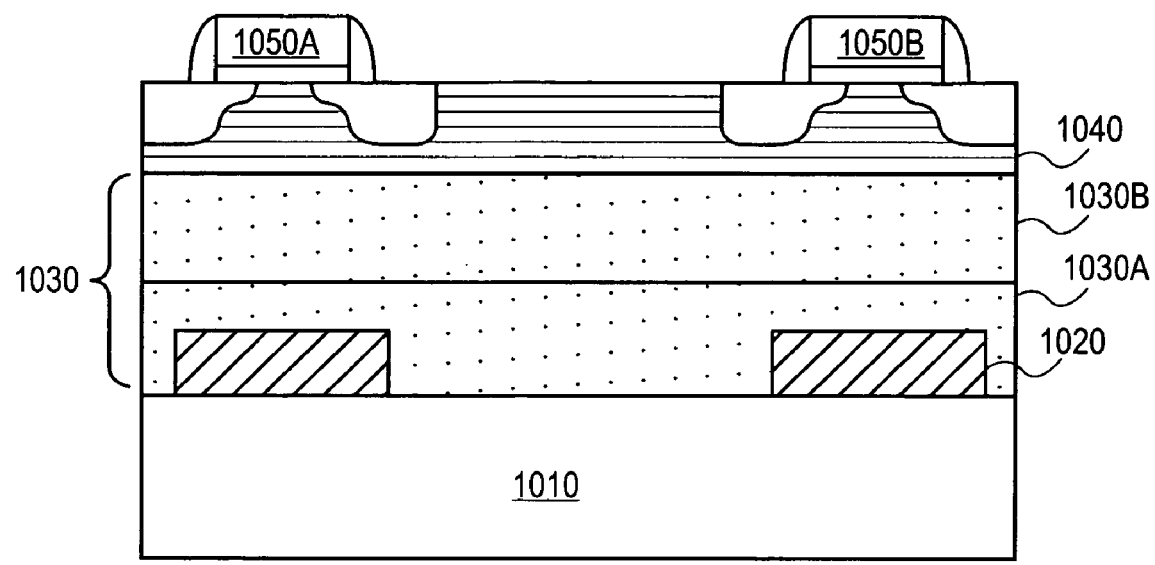

The weakened semiconductor layer above the ion implantation 6400 is then removed, or cleaved. The remaining semiconductor layer is polished as necessary, and devices 1050 are formed in the semiconductor, as shown in FIG. 6D.

To enhance the stress induced by carbon layers 1020A and 1020B in semiconductor layer 1040, semiconductor layer 1040 may be bonded to buffer layer 1030 at temperatures above 400° C. The high stiffness and modulus of diamond in the carbon layer permits high temperature processing without stress relaxation in the semiconductor layer.

Devices 1050A and 1050B are formed in the semiconductor layer above carbon layers 1020A and 1020B. Carbon layers 1020A and 1020B stress the semiconductor layer to increases carrier mobility in the channel regions of devices 1050A and 1050B. Thus, the resulting wafer enters the remaining fabrication process with built-in regions of strain. For example, if the carbon layers compressively stress the semiconductor regions, and the wafer is intended to contain both PMOS and NMOS devices, the wafer enters the remaining fabrication process requiring only tensile strain be introduced into the NMOS transistors, if desired.

Introducing tensile stress may not be necessary in certain embodiments in which NMOS devices are formed between compressively stressed regions since the compressive stress may induce sufficient tensile stress in regions surrounding the compressively stressed regions. However, if separate introduction of tensile stress is desired, stress may be introduced by use of a second carbon layer, either buried or over the devices.

FIGS. 7A-7D depicts one method of forming a second buried carbon layer to alternatively stress the semiconductor layer. The second buried carbon layer is formed on substrate 1010 subsequent to forming the first carbon layer.

Figure 7A:
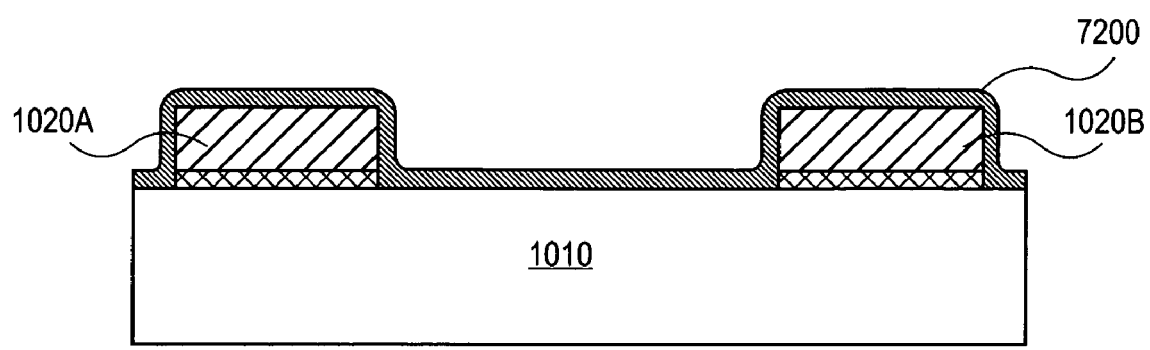
FIGS. 7A-7D are cross-sectional side views of portions of an integrated circuit at various stages of a process to form devices over buried carbon layers that alternatively stress the integrated circuit's semiconductor layer. Specifically.
Figure 7B:
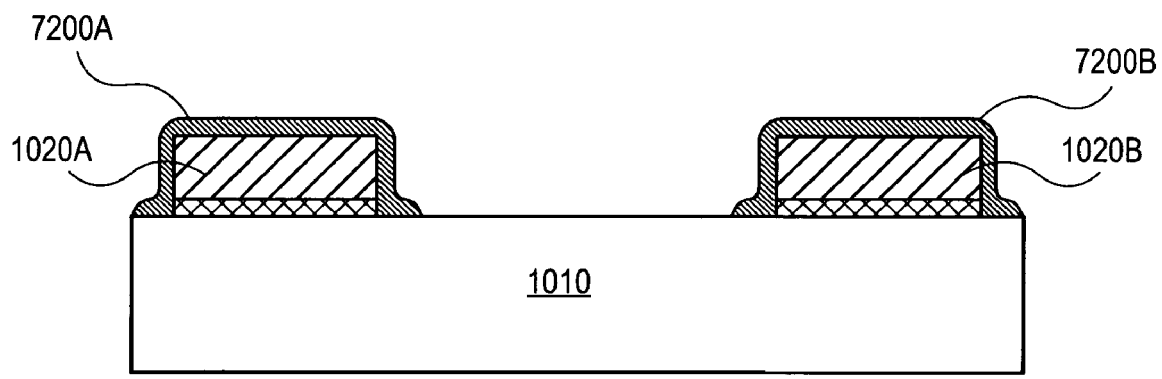

In FIG. 7A, protective layer 7200 is formed over previously formed carbon layers 1020A and 1020B. In one embodiment, protective layer 7200 is silicon nitride. Protective layer 7200 is patterned using known techniques such as masking and etching, producing sections 7200A and 7200B, as shown in FIG. 7B.

Figure 7C:
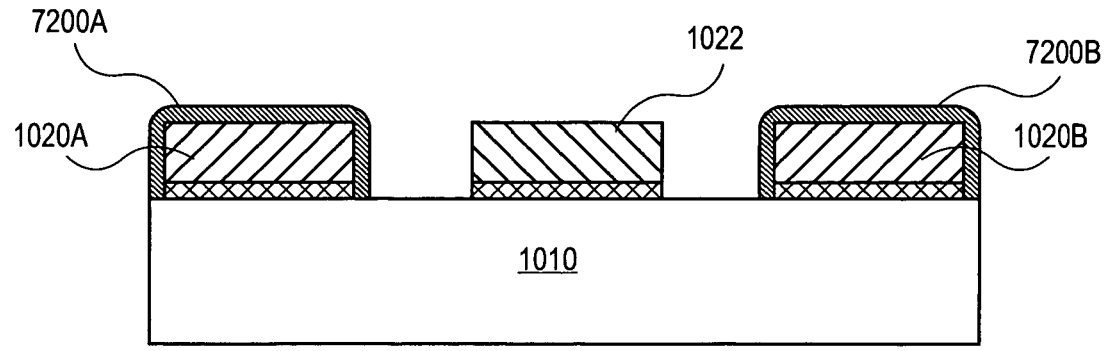

A carbon layer, e.g. layer 1022, is formed in an exposed region of the substrate. Carbon layer 1022 may be formed using the same methods as previously described, including patterning of a blanket deposit of carbon or growth of carbon on nucleation sites. In FIG. 7C, carbon layer 1022 is grown on a nucleation site. The nucleation site may be formed using previously described methods such as abrasion of the substrate and patterning of the damaged surface, or spinning of a polymer/acetone or photoresist solution containing nanocrystalline diamond particles and patterning of the resulting film.

Carbon layer 1022 is formed under such conditions as to stress the semiconductor layer differently than carbon layers 1020A and 1020B. For example, if carbon layers 1020A and 1020B were formed at lower than 700° C., so as to induce compressive stress in the semiconductor layer, then carbon layer 1022 would be formed at about 700° C. or higher to induce tensile stress in the semiconductor layer.

After protective layer 7200A and 7200B is removed, buffer layer 1030 is formed over carbon layers 1020A, 1020B and 1022, using methods such as those previously described. Buffer layer 1030 is then polished and a semiconductor layer is bonded, using methods such as those previously described.

Figure 7D:
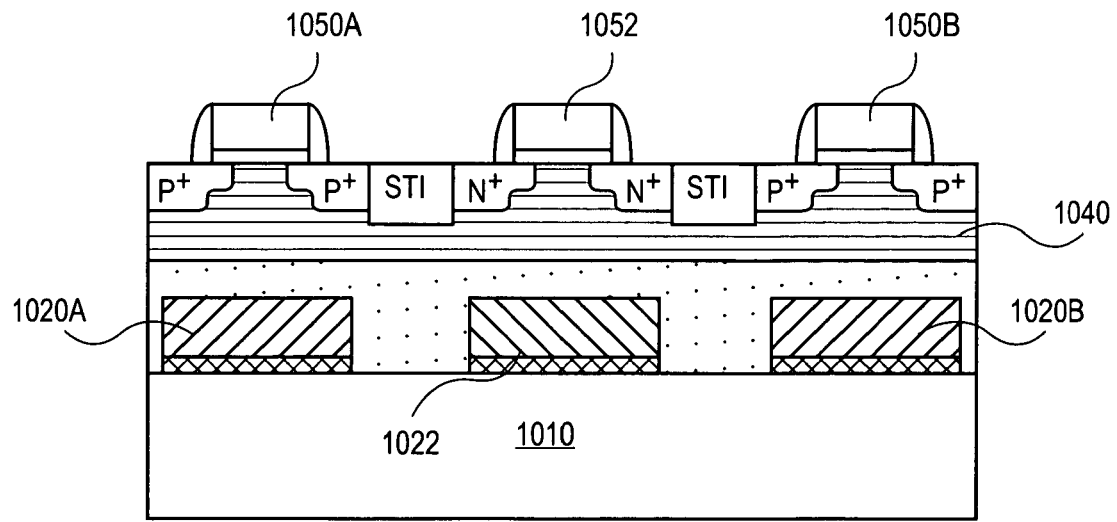

Devices are then formed in semiconductor layer 1040 over the appropriate carbon layer, as shown in FIG. 7D. For example, in one embodiment, the semiconductor regions over carbon layers 1020A and 1020B are compressively stressed and the semiconductor region over carbon layer 1022 is tensilely stressed. In such an embodiment, PMOS transistors may be formed over carbon layers 1020A and 1020B, and an NMOS device may be formed over carbon layer 1022. Carbon layers 1020A, 1020B increase hole carrier mobility by compressively stressing the channel regions of devices 1050A and 1050B. Carbon layer 1022 increase electron carrier mobility by tensilely stressing the channel region of device 1052.

In addition to inducing stress in the semiconductor layer, and therefore increasing carrier mobility, the buried carbon layers may also further improve device performance by acting as heat sinks, conveying thermal energy away from a device. Furthermore, because carbon layers 1020A, 1020B and 1022 are buried below the semiconductor layer, dislocations in the semiconductor layer are not introduced.

Figure 8:
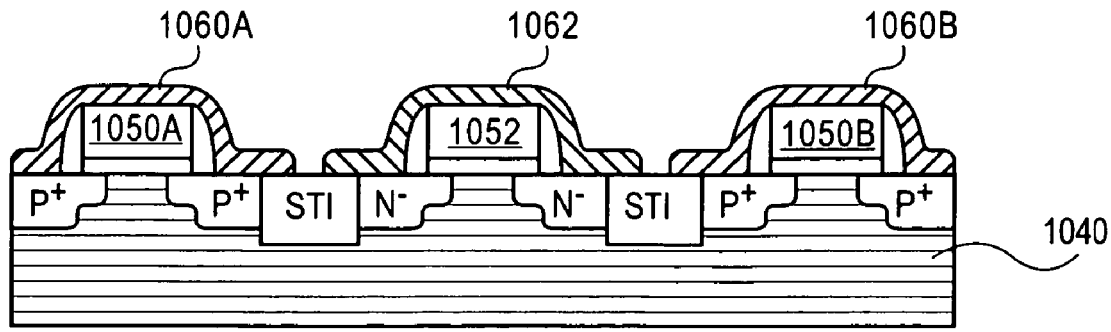
FIG. 8 is a cross-sectional side view of an integrated circuit with carbon layers formed over devices in accordance with one embodiment of this invention.

In addition to, or as a substitute for, forming buried carbon layers below devices to increase carrier mobility, carbon layers may be formed above devices to increase carrier mobility. FIG. 8 depicts the formation of alternatively stressing carbon layers over devices. In FIG. 8, carbon layers 1060A and 1060B induce a stress in devices 1050A and 1050B different from the stress induced by carbon layer 1062 in device 1052. For example, carbon layer 1060A and 1060B may induce compressive stress in devices 1050A and 1050B, while carbon layer 1062 may induce tensile stress in device 1052. In another embodiment, carbon layers 1060A and 1060B may induce tensile stress and carbon layer 1052 may induce compressive stress.

Figure 9A:
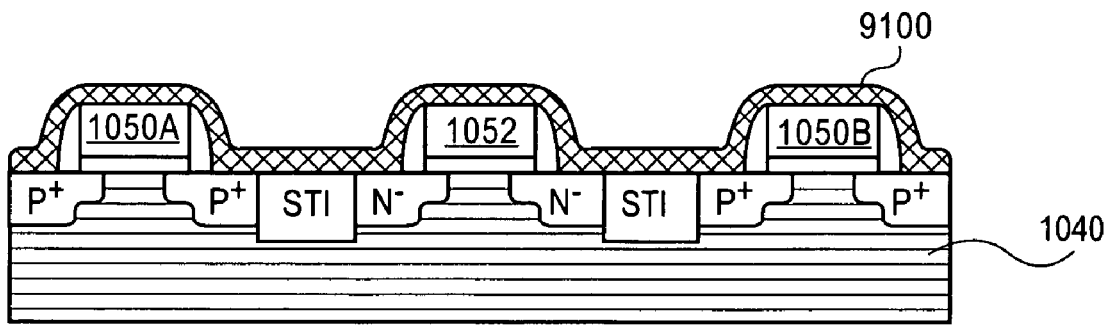
FIGS. 9A-9D are cross-sectional side views of portions of an integrated circuit in various stages of a process to form carbon layers over devices. Specifically.
Figure 9B:
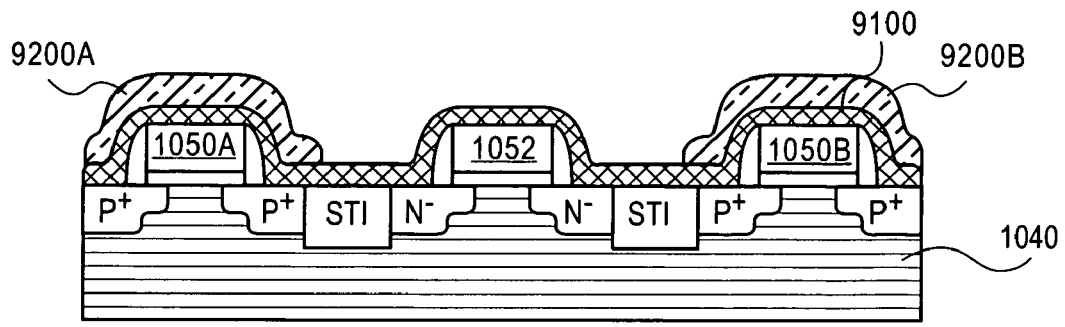

FIGS. 9A-9D depicts one method to form a carbon layer over a device to induce stress the device in accordance one embodiment of this invention. In FIG. 9A, nucleation layer 9100 is formed over devices 1050A, 1050B and 1052, regardless of whether the device would benefit from the stress to be induced. Nucleation layer 9100 may be formed using methods previously described, such as spraying on or spinning on a solvent containing nano-crystalline diamond particles. Nucleation layer 9100 is then patterned using known techniques, such as masking and etching, to facilitate selective formation of carbon over devices which would benefit from the stress to be induced.

For example, in certain embodiments, a patterned oxide layer may be used as a mask to pattern the nucleation layer. Specifically, in the embodiment of FIG. 9B, an oxide layer (e.g. a silicon dioxide layer) was formed over nucleation layer 9100 and patterned to form oxide layers 9200A and 9200B. The patterned oxide layer exposes areas of the nucleation layer. The exposed nucleation areas are selectively removed. In one embodiment, the exposed areas are removed using oxygen reactive ion etching (RIE), converting the nano-crystalline diamond particles to carbon dioxide.

Figure 9C:
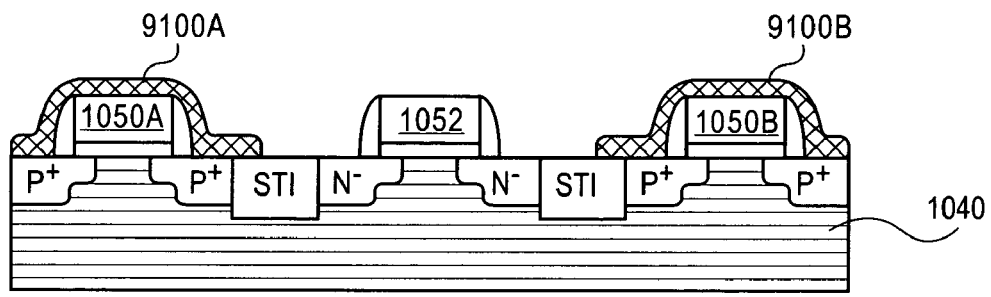
Figure 9D:
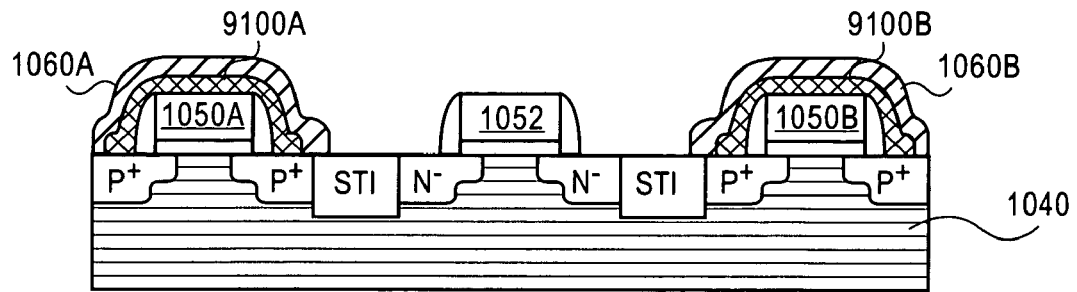

After removal of the exposed nucleation layer, the oxide layers 9200A and 9200B is removed, leaving nucleation sites 9100A and 9100B, as shown in FIG. 9C. In FIG. 9D, carbon layers 1060A and 1060B are selectively grown on nucleation sites 9100A and 9100B, again using previously described techniques. For example, in one embodiment, diamond is depositing to about 1 micron thick using a PECVD process, with methane and hydrogen as process gases. The diamond is selectively formed over the nucleation sites, and generally not over other regions, so that local stress is selectively introduced into the semiconductor.

Carbon layers 1060A and 1060B may be relatively thin and still provide enhanced carrier mobility. In one embodiment, carbon layers 1060A and 1060B are about 0.5-1.0 microns thin. Because carbon layers formed over devices may be relatively thin and still induce localized stress, they may be used to enhance carrier mobility in relatively small devices.

Figure 10A:
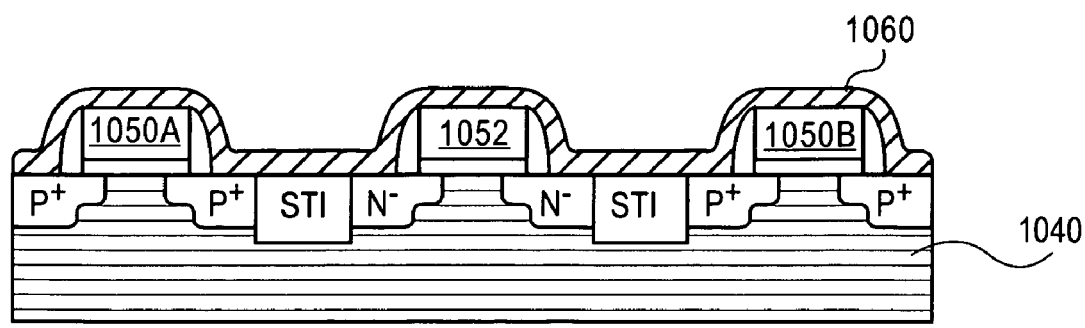
FIGS. 10A-10B are cross-sectional side views of portions of an integrated circuit at various stages of another process to form carbon layers over devices in accordance with another embodiment of this invention. Specifically.
Figure 10B:
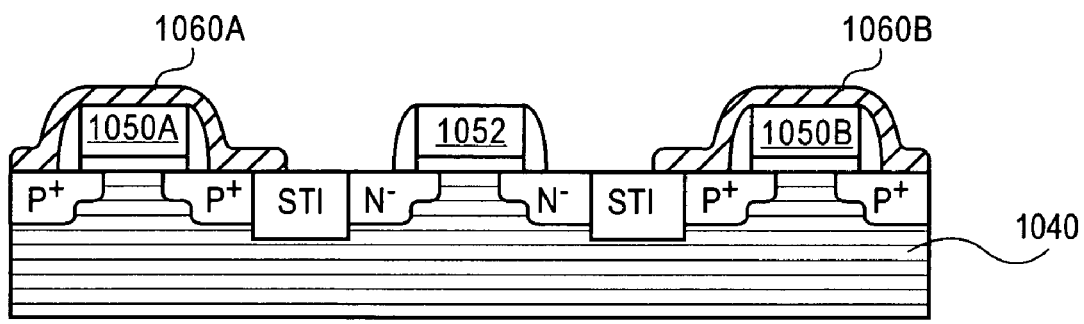

FIGS. 10A-10D depict another method to form carbon layers over devices in accordance this one embodiment of invention. In FIG. 1A, carbon layer 1060 is formed over devices 1050A, 1050B and 1052, regardless of whether the device would benefit from the stress to be induced. In one embodiment, carbon layer 1060 is about 0.5-1.0 microns thin. In FIG. 10B, carbon layer 1060 is patterned, using techniques previously described, to localize the stress to those devices which would benefit from it. For example, in one embodiment, carbon layer 1060 is formed to induce compressive stress. Carbon layer 1060 is then patterned to remove regions of the layer over NMOS devices, which would not benefit from the compressive stress, leaving regions of the carbon layer over PMOS devices, which would benefit from the compressive stress.

In another embodiment, another carbon layer is selectively formed over the remaining devices to induce an alternative stress. For example, in one embodiment, carbon layers 1060A and 1060B are first formed to induce compressive stress in PMOS devices. Then, another carbon layer is formed to induce tensile stress in NMOS devices.

Figure 11A:
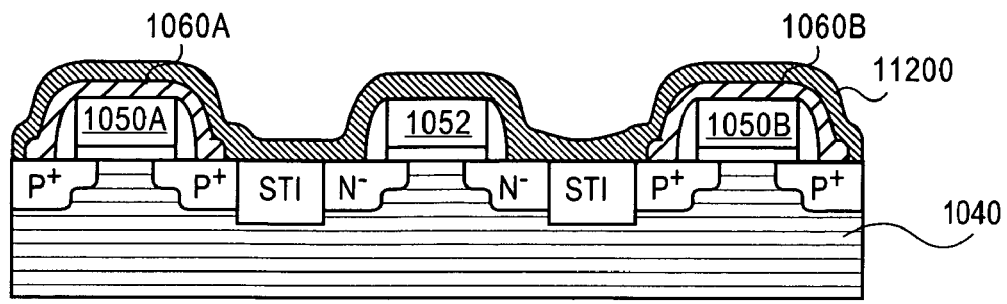
FIGS. 11A-11E are cross-sectional side views of portions of an integrated circuit at various stages of a process to form an alternatively stressing carbon layer over a device subsequent to forming carbon layers over other devices in the integrated circuit accordance with one embodiment of this invention. Specifically.
Figure 11B:
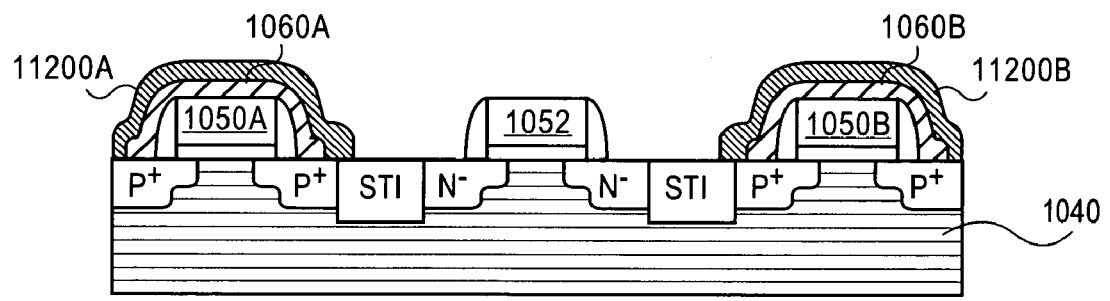

FIGS. 11A-11E depict one method to form the second carbon layer over devices to induce an alternative stress. In FIG. 11A, a protective layer 11200 is deposited over the previously formed carbon layer 1060A and 1060B and exposed devices, such as device 1052. In one embodiment, the protective layer is silicon nitride. In FIG. 11B, protective layer 11200 is patterned to shield previously formed carbon layers 1060A and 1060B. Protective layer 11200 may also be patterned so as to shield any other devices on which the alternatively stressing carbon layer is not desired.

Figure 11C:
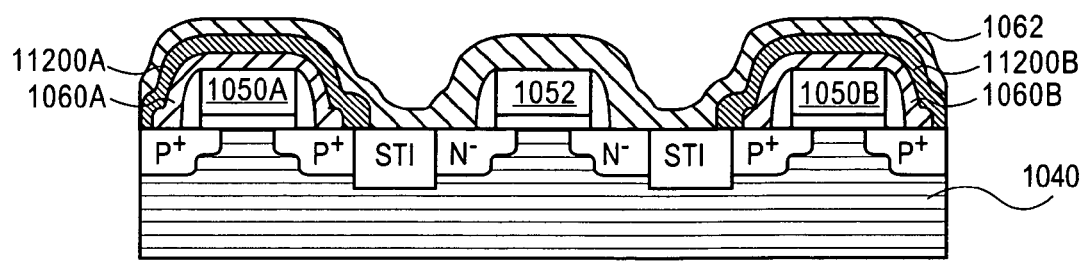

In FIG. 11C, the alternatively stressing carbon layer 1062 is formed over the device layer, including protective layers 11200A and 11200B and exposed devices (e.g. device 1052). Carbon layer 1062 may be formed using previously described processes, such as PECVD, under such conditions so as to induce a stress opposite the stress induced by carbon layers 1060A and 1060B.

Figure 11D:
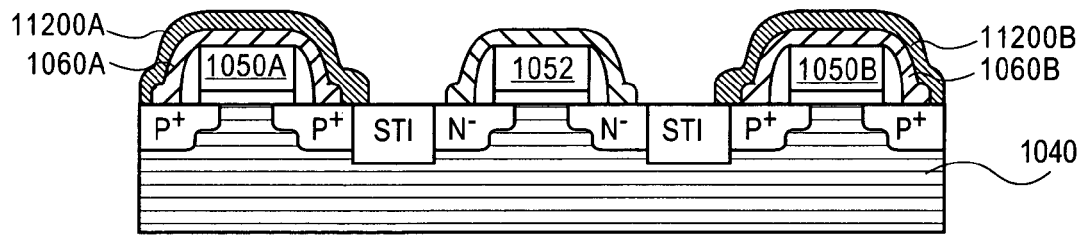
Figure 11E:
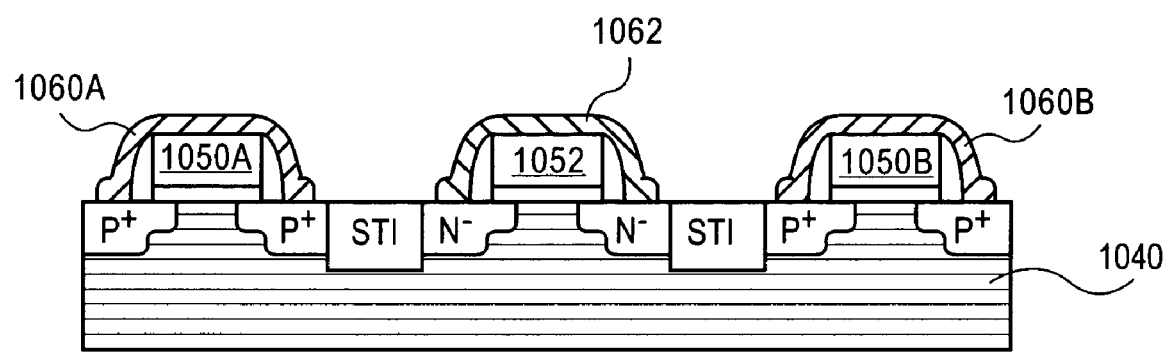

In FIG. 11D, carbon layer 1062 is patterned using techniques previously described, e.g. masking and etching. In FIG. 11E, the remaining protective layer is removed leaving carbon layers inducing localized stress over certain devices. Specifically, in the embodiment of FIG. 11E, carbon layer 1060A and 1060B induce compressive stress in devices 1050A and 1050B, while carbon layer 1062 induces tensile stress in device 1052.

In certain embodiments, carbon layers 1060A, 1060B and 1062 are formed on a wafer with buried carbon layers, such as 1020A, 1020B and 1022 in FIG. 1. In those embodiments, carbon layers 1060A, 1060B and 1062 should induce the same type of stress as is induced by the corresponding buried carbon layer, so as to reinforce, rather than cancel, the effects of the buried carbon layer. For example, if carbon layer 1020A and 1020B induce compressive stress in the channel region of device 1050A and 1050B, then carbon layer 1060A and 1060B should also induce compressive stress in device 1050A and 1050B. Similarly, if carbon layer 1022 induces tensile stress in the channel region of device 1052, then carbon layer 1062 should also induce tensile stress in device 1052.

Figure 12:
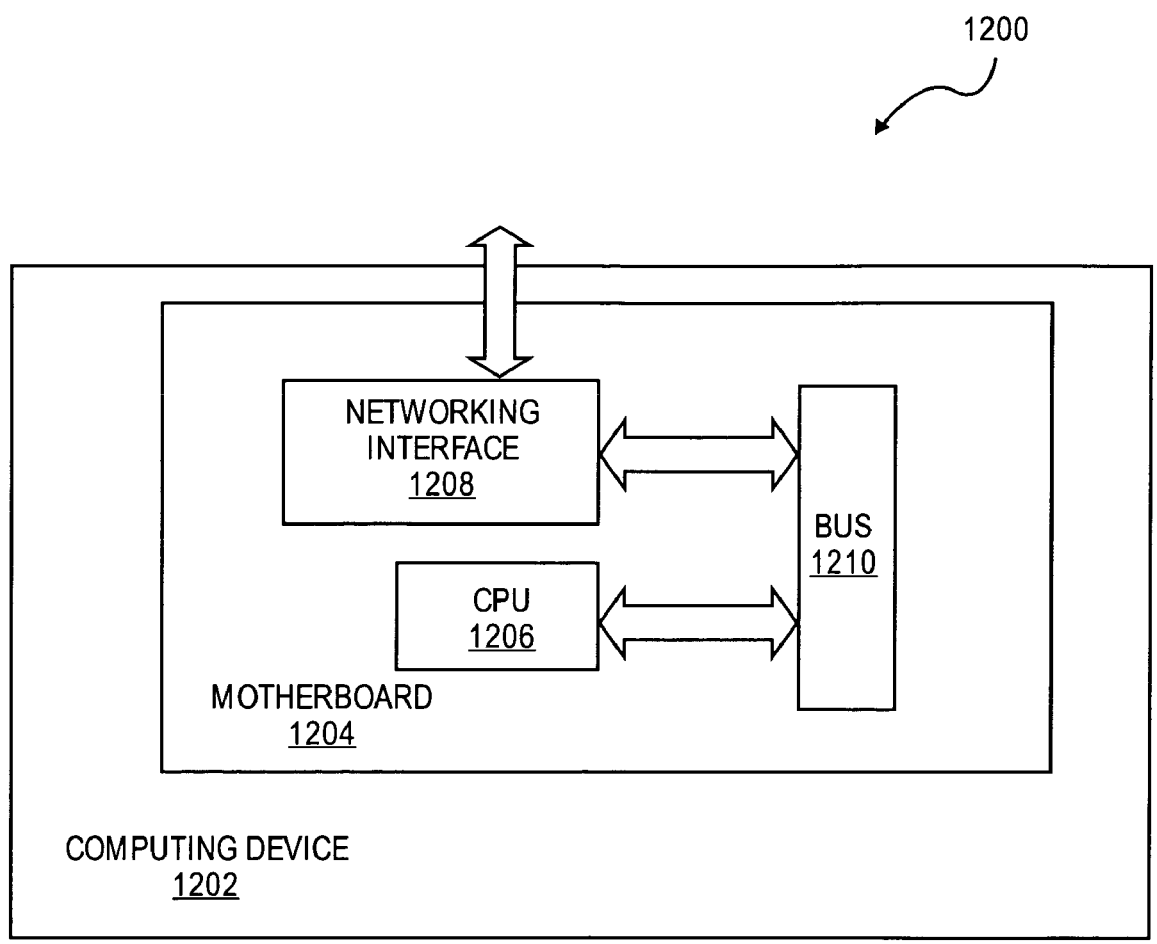
FIG. 12 illustrates a system in accordance with one embodiment of this invention.

FIG. 12 illustrates a system 1200 in accordance with one embodiment. As illustrated, for the embodiment, system 1200 includes computing device 1202 for processing data. Computing device 1202 may include a motherboard 1204. Motherboard 1204 may include in particular a processor 1206, and a networking interface 1208 coupled to a bus 1210. More specifically, processor 1206 may comprise the device 1050A, 1050B or 1052 that has the earlier described stress inducing carbon layer.

Depending on the applications, system 1200 may include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described stress inducing carbon layer.

In various embodiments, system 1200 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Thus, devices and methods of producing devices under compressive or tensile stress are disclosed. Although the figures and descriptions have details with regards to bulk wafers, it shall be appreciated that the same methodology may be applied to other semiconductor designs, such as dual gate and trigate transistors.

While the invention has been described in terms of several embodiments, those of ordinary skill in the art will recognize that the invention is not limited to the embodiments described, but can be practiced with modification and alteration within the spirit and scope of the appended claimed. The description is thus to be regarded as illustrative instead of limiting.

We claim:

1. A method, comprising:
    forming a carbon layer on a substrate;
    forming a semiconductor layer above the carbon layer, the carbon layer to stress the semiconductor layer, wherein the carbon layer is discontinuous;
    forming a device in said semiconductor layer above said carbon layer.

2. The method of claim 1, wherein the carbon layer is a stressed diamond layer, wherein forming the stressed diamond layer comprises:
    depositing a continuous stressed diamond layer; and
    patterning the continuous stressed diamond layer.

3. The method of claim 1, wherein the carbon layer is a stressed diamond layer, wherein forming the stressed diamond layer comprises:
    abrading the substrate;
    patterning the abraded substrate; and
    growing a stressed diamond layer on the abraded substrate.

4. The method of claim 1, wherein the carbon layer is a stressed diamond layer, wherein forming the stressed diamond layer comprises:
    depositing a solution comprising crystalline carbon particles to form a film;
    patterning the film; and
    growing a stressed diamond layer on the film.

5. A method, comprising:
    forming a stressed diamond layer above a substrate;
    depositing a buffer layer over to the stressed diamond layer;
    forming a silicon layer above the buffer layer such that the silicon layer is stressed;
    forming a transistor in the silicon layer; and
    wherein the buffer layer comprises a polysilicon layer and a silicon dioxide layer.

6. A method, comprising:
    forming a discontinuous tensilely stressed carbon layer over a substrate;
    forming a discontinuous compressively stressed carbon layer over the substrate;
    forming an polycrystalline layer over both the tensilely stressed and compressively stressed carbon layers; and
    forming a semiconductor layer over the polycrystalline layer such that the semiconductor layer above the tensilely stressed carbon layer is compressively stressed and the semiconductor layer above the compressively stressed carbon layer is tensilely stressed.

7. The method of claim 6, wherein the polycrystalline layer is polysilicon.

8. The method of claim 6, wherein forming the semiconductor layer comprises:
    growing an oxide layer adjacent to a semiconductor substrate;
    implanting ions within the semiconductor substrate to form a dislocation to separate the semiconductor substrate into a first portion and a second portion, the first portion disposed between the oxide layer and ions, and the second portion disposed adjacent to the ions;
    bonding the oxide layer and the polycrystalline layer; and
    removing the second portion.

9. The method of claim 6, wherein forming the discontinuous compresssively stressed carbon layer comprises:
    depositing a nitride layer on the substrate and discontinuous tensilely stressed carbon layer;
    selectively removing the nitride layer superjacent to the substrate;
    forming nucleation sites superjacent to the substrate; and
    forming the discontinuous compressively stressed carbon layer on the nucleation sites.

10. A method comprising:
    forming a transistor having a channel region in a semiconductor layer; and
    forming a stressed carbon layer over the channel region of the transistor, the carbon layer to produce stress in the channel region; and
    wherein forming the stressed carbon layer comprises forming the stressed carbon layer with carbon particles having a grain size to produce tensile stress in the silicon layer.

11. The method of claim 10, wherein forming the stressed carbon layer comprises forming the stressed carbon layer at greater than or equal to 700 C to produce tensile stress in the silicon layer.

12. The method of claim 10, wherein the grain size is less than 10 microns.

13. The method of claim 10, wherein the carbon layer comprises graphite and diamond.

14. The method of claim 13, wherein the carbon layer comprises less than 20% graphite and is to produce tensile stress in the silicon layer.

15. An apparatus comprising:
    a stressed carbon layer formed over a substrate;
    a semiconductor layer formed over the carbon layer, the carbon layer to stress the semiconductor layer, wherein the stressed carbon layer is discontinuous; and
    a device formed in said semiconductor layer above said stressed carbon layer.

16. An apparatus comprising:
    a transistor having a channel region formed in a semiconductor layer; and
    a first stressed carbon layer formed over the channel region of the transistor, the first stressed carbon layer producing a stress in the channel region; and
    wherein the first carbon layer is under tensile stress.

17. The apparatus of claim 16, further comprising a second stressed carbon layer below the semiconductor layer, the second carbon layer to further stress the semiconductor layer.

18. The apparatus of claim 17, wherein the first and second carbon layers are to spread thermal energy away from the device.

* * * * *